US006937091B2

(12) United States Patent
Tanaka et al.

(10) Patent No.: US 6,937,091 B2
(45) Date of Patent: Aug. 30, 2005

(54) CLASS D AMPLIFIER

(75) Inventors: Yasuomi Tanaka, Hamakita (JP); Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/632,248

(22) Filed: Aug. 1, 2003

(65) Prior Publication Data

US 2004/0021512 A1 Feb. 5, 2004

(30) Foreign Application Priority Data

Aug. 2, 2002 (JP) .................................... P. 2002-226628

(51) Int. Cl.[7] ............................ H03F 3/38; H03F 3/217

(52) U.S. Cl. .......................................... 330/10; 330/251

(58) Field of Search ............................... 330/10, 207 A, 330/251

(56) References Cited

U.S. PATENT DOCUMENTS 5,838,193 A * 11/1998 Myers et al. ................. 330/10

* cited by examiner

*Primary Examiner*—Steven J. Mottola
(74) *Attorney, Agent, or Firm*—Pillsbury Winthrop Shaw Pittman LLP

(57) ABSTRACT

A complementary signal generating circuit (301) generates first complementary signals (S1, S2) from a PWM signal. A signal converting circuit (302) converts the first complementary signals to second complementary signals (S3, S4 or S5, S6) having a voltage component based on a negative power supply (VPP−). Among the second-complementary signals, the signals (S3, S4) are supplied to a driving circuit (305), and the signals (S5, S6) are supplied to a current driving circuit (303). In response to the signals (S5, S6), the current driving circuit outputs third complementary signals (H3, H4) having a current component that is directed toward the negative power supply (VPP−), to a driving circuit (304). As a result, the driving circuits (304, 305) complementarily drive power-MOS transistors (401, 402).

4 Claims, 6 Drawing Sheets

CLASS D AMPLIFIER

BACKGROUND OF THE INVENTION

The present invention relates to a class D amplifier (digital amplifier) which converts an analog signal such as a music signal to a pulse signal, and power-amplifies the signal, and more particularly to a circuit technique for driving and controlling output power MOS-transistors.

Conventionally, a class D amplifier is known which receives an analog signal such as a music signal as an input signal, converts the signal to a pulse signal, and then power-amplifies the signal. An output terminal of the amplifier is connected to an input terminal of a loudspeaker via a low-pass filter. In such a class D amplifier, a pulse signal is power-amplified while reflecting the amplitude (information components) of the input signal to the pulse width, and the pulse signal is output. The pulse signal is then passed through the low-pass filter, whereby the power-amplified analog music signal is extracted. The loudspeaker is driven by the music signal. A class D amplifier can be formed on a silicon chip, and hence realized in a small size and in an economical manner, so that it is widely used in a portable terminal device or a personal computer which is requested to consume a small power.

FIG. 7 shows the configuration of a class D amplifier 900, and an application example of the amplifier.

Referring to the figure, a signal source SIG is a source of an analog music signal VIN in which the midpoint of the amplitude is set to the ground potential (0 V), and connected to an input terminal TI of the class D amplifier 900 via an input capacitor (not shown) for cutting off a DC component contained in the music signal. The class D amplifier 900 is a so-called PWM amplifier (PWM: Pulse Width Modulation), and configured by an input stage 901, a modulating circuit 902, a drive controlling circuit 903, and n-type power-MOS transistors 904 and 905.

The input stage 901 moves the midpoint of the music signal VIN to convert the music signal VIN to a signal conforming to the input characteristics of the modulating circuit 902 which is operated by a power supply VDD (for example, 10 V). The modulating circuit 902 converts the music signal output from the input stage 901 to a pulse signal by the PWM modulation so that the music signal is modulated to a pulse signal while information components of the music signal are reflected to the pulse width. On the basis of the pulse signal which is modulated in the modulating circuit 902, the drive controlling circuit 903 complementarily drives and controls the output power-MOS transistors 904 and 905.

The power-MOS transistor 904 in which the current path is connected between a positive power supply VPP+ (for example, +50 V) and an output terminal TO is used for outputting a high level. The power-MOS transistor 905 in which the current path is connected between a negative power supply VPP− (for example, −50 V) and the output terminal TO is used for outputting a low level. The output terminal TO is connected to a loudspeaker SPK via a low-pass filter consisting of an inductor L and a capacitor C.

In the class D amplifier 900, the music signal VIN supplied from the signal source SIG is passed through the input stage 901 and the modulating circuit 902 to be converted to a pulse signal. In the conversion, the modulating circuit 902 performs PWM-modulation on a carrier signal in accordance with the music signal VIN. On the basis of the modulated pulse signal, the drive controlling circuit 903 complementarily controls the conduction states of the power-MOS transistors 904 and 905, and outputs the power-amplified pulse signal to the output terminal TO. In the power-amplified pulse signal, the carrier frequency component is removed away by the low-pass filter consisting of the inductor L and the capacitor C, to be formed as a power-amplified analog music signal. The signal is then supplied to the loudspeaker SPK.

The modulating circuit 902 is configured so as to be operated by the single power supply VDD (for example, 10 V). Consequently, the low level of the pulse signal which is the output signal of the circuit is equal to the ground potential (0 V), and the high level is equal to the voltage (10 V) supplied from the power supply VDD. When the pulse signal having such signal levels is used as it is, the power-MOS transistor 904 in which the drain is connected to a positive power supply VPP+ (for example, +50 V) cannot be sufficiently controlled to the on state because of the characteristics of a MOS transistor, and the power-MOS transistor 905 in which the source is connected to the negative power supply VPP− (for example, −50 V) cannot be sufficiently controlled to the off state. Therefore, the drive controlling circuit 903 must have a function of controlling the power-MOS transistors 904 and 905 on the basis of the pulse signal which is modulated in the modulating circuit 902.

Hereinafter, the drive controlling circuit 903 will be described. In order to control the conduction states of the power-MOS transistors 904 and 905 which output a signal changing between the positive power supply VPP+ and the negative power supply VPP−, a pulse signal of a large amplitude corresponding to the positive power supply VPP+ and the negative power supply VPP− is requested to be supplied from the drive controlling circuit 903 to the gates of the power-MOS transistors 904 and 905. In this case, the drive controlling circuit 903 must be configured by using high-breakdown voltage transistors, thereby causing the production cost to be increased. Therefore, the drive controlling circuit 903 is configured by employing a technique in which effective power supply voltages applied to circuits for respectively driving the power-MOS transistors 904 and 905 are lowered by isolating power supply systems of the circuits from each other.

In the example shown in FIG. 7, both the power-MOS transistors 904 and 905 are of the n-type, and hence the power supply system of the drive controlling circuit 903 is separated into a power supply system based on the source voltage of the power-MOS transistor 904, i.e., the voltage of the output signal appearing at the output terminal TO, and that based on the source voltage of the power-MOS transistor 905, i.e., the voltage supplied from the negative power supply VPP−. The power supply system of the circuit for driving the power-MOS transistor 904 is raised with following the voltage change of the output signal appearing at the output terminal TO. When the power supply system of the drive controlling circuit 903 is configured so as to follow the output signal appearing at the output terminal TO, however, the input threshold of the drive controlling circuit 903 is varied with respect to the level of the pulse signal output from the modulating circuit 902 in the preceding stage, thereby causing a disadvantage that the signal cannot be correctly transmitted from the modulating circuit 902 to the drive controlling circuit 903.

As a first conventional technique which can solve the disadvantage, there is a technique in which the bootstrap circuit technique is used for raising the pulse signal output from the modulating circuit 902 to a signal level conforming to the drive controlling circuit 903.

As a second conventional technique, there is a technique in which an insulating transformer is used for converting the voltage of the pulse signal output from the modulating circuit 902 to a signal level conforming to the drive controlling circuit 903.

As a third conventional technique, there is a technique in which a photocoupler is used for converting the pulse signal output from the modulating circuit 902 to an optical signal and transmitting the optical signal toward the drive controlling circuit 903.

In the first conventional technique, a bootstrap circuit is used in order to convert the level of the signal output from the modulating circuit, and hence there is a problem in that the operation becomes unstable when the signal has a high frequency.

In the second and third conventional techniques, since electronic components such as the insulating transformer and the photocoupler are relatively expensive, the production cost is increased. Moreover, a space for mounting such electronic components must be assured, and hence the whole amplifier is bulky.

In the conventional configuration shown in FIG. 7, the modulating circuit 902 is operated by the power supply VDD of a 10-V system. If all blocks of the input stage 901, the modulating circuit 902, and the drive controlling circuit 903 are operated by the positive power supply VPP+ and the negative power supply VPP− which are high voltage systems, it is not required to convert the signal level, and the circuit configuration can be simplified. In this case, a production technique of a high-breakdown voltage process must be used for all the blocks. Even when the blocks are formed into separate ICs, therefore, the production cost of each IC is increased.

SUMMARY OF THE INVENTION

The invention has been conducted in view of the circumstances noted above. It is an object of the invention to provide a class D amplifier in which output power-MOS transistors can be driven and controlled without using special circuit techniques or electronic components, and the use of a high-breakdown voltage process can be suppressed to a minimum required level.

In order to achieve the aforesaid object, the invention is characterized by having the following arrangement.

In order to achieve the aforesaid object, the invention is characterized by having the following arrangement.

Aspect 1. A class D amplifier comprising:

a modulating circuit which modulates an input signal to a pulse signal;

a first output transistor, a current path of which is connected between a positive power supply and an output terminal;

a second output transistor, a current path of which is connected between a negative power supply, and the output terminal; and a drive controlling circuit which complementarily drive the first and second output transistors based on the pulse signal from the modulating circuit, the drive controlling circuit including:

- a signal generating circuit which generates first complementary signals including positive-phase and negative-phase signals with respect to the pulse signal;
- a signal converting circuit which converts the first complementary signals to second complementary signals having a voltage component based on the negative power supply;
- a current driving circuit which, in response to the second complementary signals, outputs third complementary signals having a current component flowing toward the negative power supply;
- a first driving circuit which, in response to the third complementary signals, drives the first output transistor; and
- a second driving circuit which, in response to the second complementary signals, drives the second output transistor.

Aspect 2. The class D amplifier according to the aspect 1, wherein the signal converting circuit includes:

first and second bipolar transistors, bases of which are commonly biased to a ground potential, and emitters of which are connected to outputs of the signal generating circuit from which the first complementary signals are output via first and second resistors, respectively;

third and fourth resistors connected between collectors of the first and second bipolar transistors and the negative power supply, respectively.

Aspect 3. The class D amplifier according to the aspect 2, wherein the current driving circuit includes:

third and fourth bipolar transistors, emitters of which are connected to the third and fourth resistors, respectively, collectors of which are connected to inputs of the first driving circuit, respectively, and bases of which are commonly biased to a predetermined potential based on the negative power supply.

Aspect 4. The class D amplifier according to the aspect 3, wherein values of first to fourth resistors are set so that emitter voltages of the third and fourth bipolar transistors are lower than the predetermined potential based on the negative power supply by a base-collector voltage.

DETAILED DESCRIPTION OF PREFERRED EMBODIMENTS

Hereinafter, an embodiment of the invention will be described with reference to the accompanying drawings.

Figure 1:
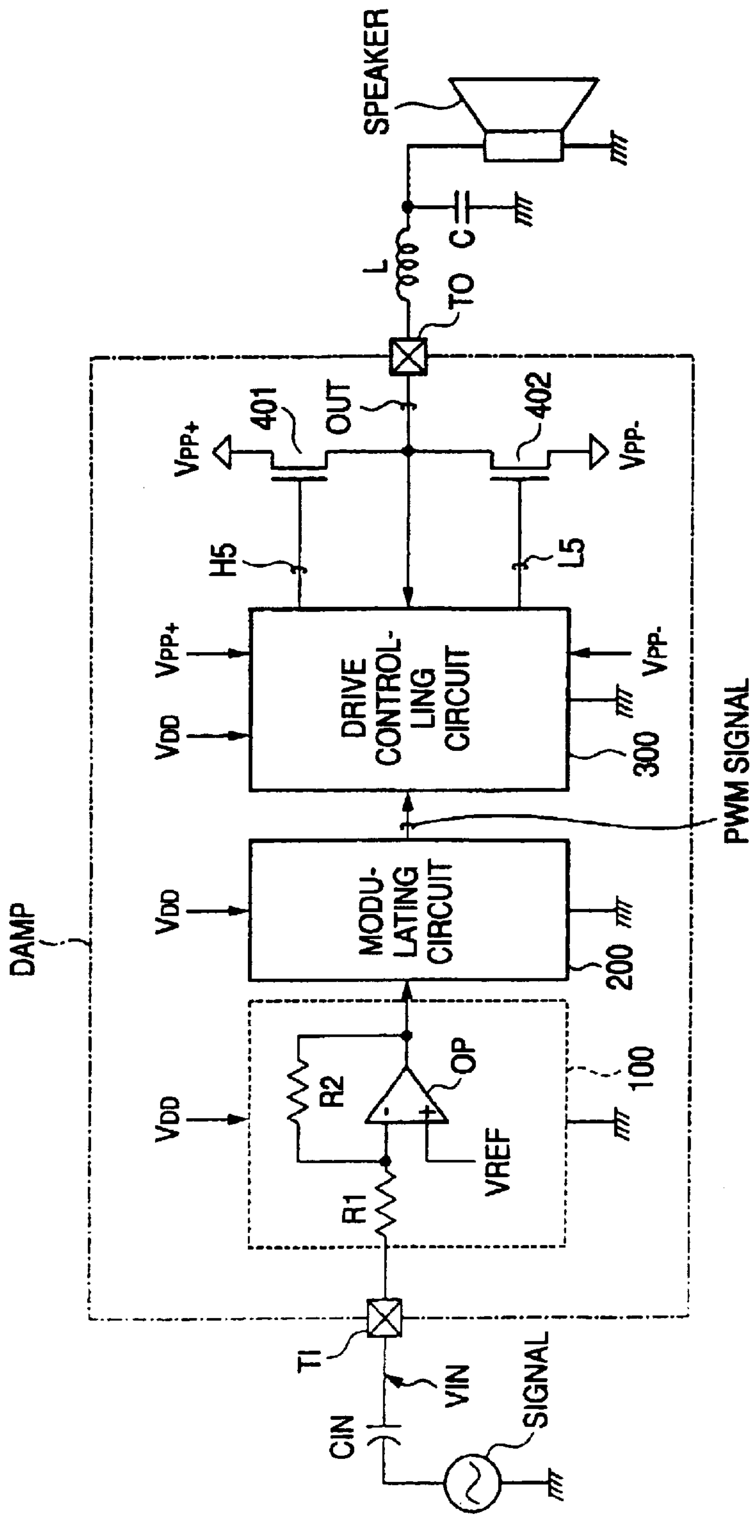
FIG. 1 is a diagram showing the configuration of a class amplifier of an embodiment of the invention.

FIG. 1 shows the configuration of a class D amplifier DAMP according to the embodiment. Referring to the figure, a signal source SIG is a source of a (analog) music signal in which the midpoint of the amplitude is set to the ground potential (0 V). The signal of the signal source SIG is supplied as a music signal VIN to an input terminal TI of the class D amplifier DAMP via an input capacitor CIN. The class D amplifier DAMP is a so-called PWM amplifier, and configured by an input stage 100, a modulating circuit 200, a drive controlling circuit 300, and n-type output power-MOS transistors 401 and 402.

The input stage 100 is configured by an input resistor R1, a feedback resistor R2(=R1), and an operational amplifier OP. One end of the input resistor RI is connected to the inverting input (−) of the operational amplifier OP, and the other end of the resistor to an input terminal T1. The feedback resistor R2 is connected between the inverting input and the output of the operational amplifier OP. A reference voltage VREF is applied to the non-inverting input (+) of the operational amplifier OP. The reference voltage VREF is generated by, fqr example, resistance-dividing a voltage which is supplied from a standard power supply VDD, and set to one half of the voltage of the power supply VDD. In the embodiment, the voltage of the power supply VD is "10 V", or a standard power supply voltage in the art. The modulating circuit 200 converts a music signal output from the preceding input stage 100 by applying PWM modulation to a pulse signal (PWM signal). The drive controlling circuit 300 complementarily drives and controls the output power-MOS transistors 401 arid 402. The drive controlling circuit 300 will be described in detail later.

The output power-MOS transistor 401 is used for outputting a high level to an output terminal TO, and the drain and the source are connected to a positive power supply VPP+ (high power supply) and the output terminal TO, respectively. The other output power-MOS transistor 402 is used for outputting a low level to the output terminal TO, and the drain and the source are connected to the output terminal TO and a negative power supply VPP− (low power supply), respectively. In the embodiment, the voltage of the positive power supply VPP+ is "+50 V", and that of the negative power supply VPP− is "−50 V". One of the input terminals of a loudspeaker SPK is connected to the output terminal TO via a low-pass filter consisting of an inductor L and a capacitor C, and the other input terminal of the loudspeaker SPK is grounded. The constant of the low-pass filter consisting of the inductor L and the capacitor C is set so that the carrier frequency component is removed away from the pulse signal which is output from the class D amplifier DAMP via the output terminal TO, and music signal components are passed through the filter.

As described above, the class D amplifier DAMP is operated by the three power supplies, i.e., the standard power supply VDD, the positive power supply VPP+, and the negative power supply VPP−.

Figure 2:
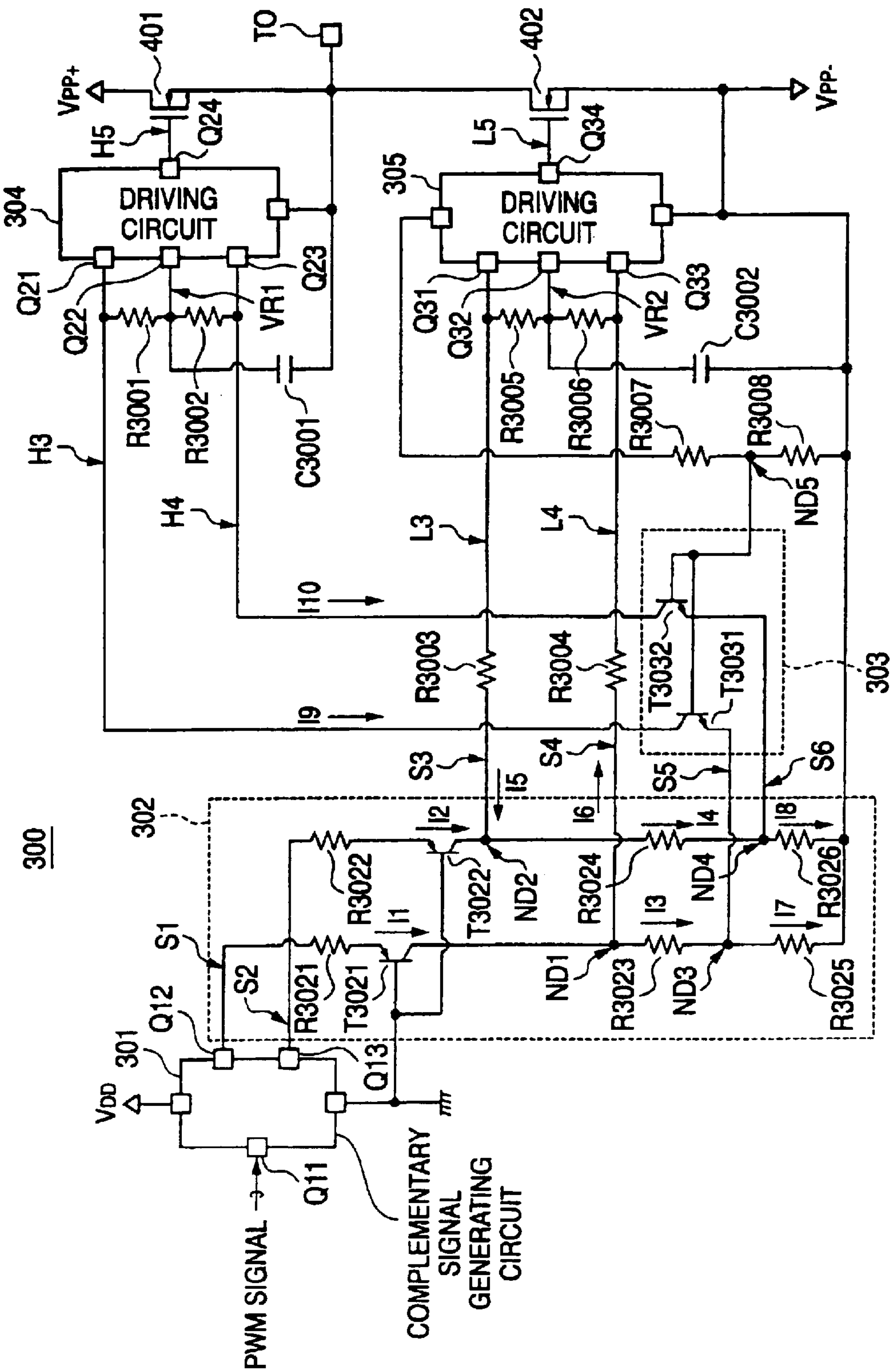
FIG. 2 is a circuit diagram showing the configuration of a drive controlling circuit in the embodiment.

Next, the configuration of the drive controlling circuit 300 will be described in detail. FIG. 2 shows the configuration of the drive controlling circuit 300. In FIG. 2, the components identical with those shown in FIG. 1 are denoted by the same reference numerals, and, for the sake of convenience in description, also the output power-MOS transistors 401 and 402 are shown.

Figure 3:
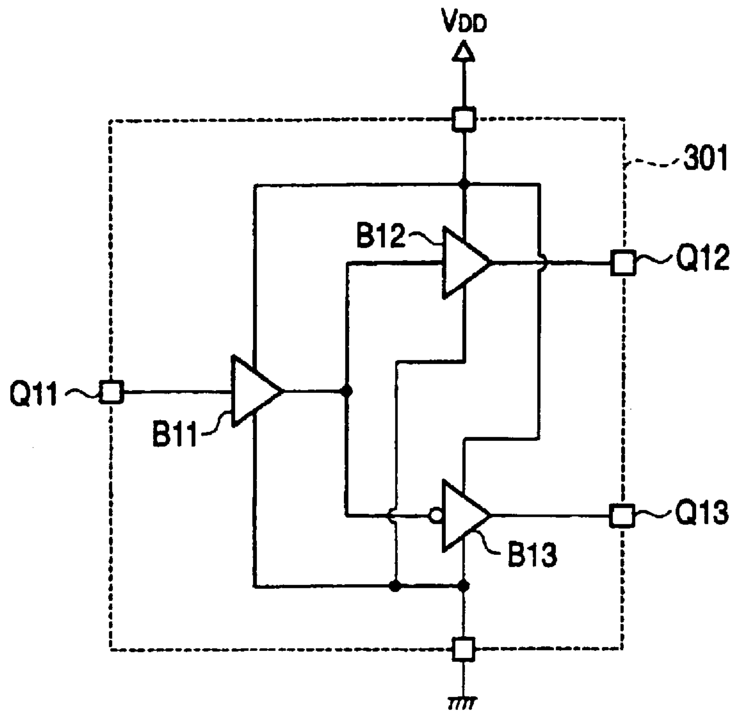
FIG. 3 is a circuit diagram showing the configuration of a signal generating circuit in the embodiment.

A complementary signal generating circuit 301 is disposed in a first stage of the drive controlling circuit 300. The complementary signal generating circuit 301 generates complementary signals (first complementary signals) consisting of a positive-phase signal S1 and a negative phase signal S2 with respect to the PWM signal which is output from the above-mentioned modulating circuit 200, and is configured by buffers B11 and B12, and a negative logic input type buffer (inverting buffer) B13 as shown in FIG. 3. Specifically, an input of the buffer B11 is connected to a terminal Q11 to which the PWM signal output from the modulating circuit 200 is supplied, and an output of the buffer is connected to inputs of both the buffers B12 and B13. Outputs of the buffers B12 and B13 are connected to terminals Q12 and Q13, respectively. The buffers B11, B12, and B13 are supplied with the power supply VDD and the ground potential to operate, and the buffers B12 and B13 output the positive-phase signal S1 and the negative-phase signal S2 with respect to the PWM signal via the terminals Q12 and Q13, respectively. The positive-phase signal S1 and the negative-phase signal S2 have an amplitude from the ground potential (0 V) to the power supply VDD (10 V), and are supplied to a signal converting circuit 302.

The signal converting circuit 302 is connected in a stage subsequent to the complementary signal generating circuit 301. The signal converting circuit 302 converts the complementary signals consisting of the positive-phase signal S1 and the negative-phase signal S2, to complementary signals S3 and S4, and complementary signals S5 and S6 (second complementary signals) having a voltage component based on the negative power supply VPP−. The signal converting circuit is configured by resistors R3021 to R3026, and pnp bipolar transistors T3021 and T3022. The emitter of the pnp bipolar transistor T3021 is connected to the terminal Q12 which is the one output of the complementary signal generating circuit 301, via the resistor R3021. The emitter of the pnp bipolar transistor T3022 is connected to the terminal Q13 which is the other output of the complementary signal generating circuit 301, via the resistor R3022. The bases of the pnp bipolar transistors T3021 and T3022 are commonly biased to the ground potential. Resistors R3023 and R3025 are connected in series in this sequence between the collector of the one pnp bipolar transistor T3021 and the negative power supply VPP−. Resistors R3024 and R3026 are connected in series in this sequence between the collector of the other pnp bipolar transistor T3022 and the negative power supply VPP−.

A connection node ND1 of the collector of the pnp bipolar transistor. T3021 and the resistor R3023 is connected to a terminal Q33 which is an input of a driving circuit 305, via a resistor R3004, and a connection node ND2 of the collector of the pnp bipolar transistor T3022 and the resistor R3024 is connected to a terminal Q31 which is an input of the driving circuit 305, via a resistor R3003. A resistor R3005 is connected between the terminal Q31 and a terminal Q32 of the driving circuit 305, and a resistor R3006 is connected between the terminal Q32 and the terminal Q33. A connection node (not denoted by a reference numeral) of the resistors R3005 and R3006 is biased to a predetermined voltage VR2 via the terminal Q32.

A current driving circuit 303 is connected in the subsequent stage of the signal converting circuit 302. The current driving circuit 303 outputs complementary signals (third complementary signals) consisting of signals H3 and H4 having a current component (I9, I10) directed toward the negative power supply VPP−, in response to the complementary signals consisting of the signals S5 and S6. The current driving circuit is configured by npn bipolar transistors T3031 and T3032. The emitter of the one npn bipolar transistor T3031 is connected between the collector of the pnp bipolar transistor T3021 constituting the signal converting circuit 302, and the resistor R3025, specifically to a connection node ND3 of the resistors R3023 and R3025. The emitter of the other npn bipolar transistor T30321 is connected between the collector of the pnp bipolar transistor T3022 constituting the signal converting circuit 302, and the resistor R3026, specifically to a connection node ND4 of the resistors R3024 and R3026. The bases of these transistors are commonly biased to a predetermined potential (a potential based on the negative power supply VPP−) appearing at a connection node ND5 which will be described later.

The collector of the npn bipolar transistor T3031 is connected to a terminal Q21 which is an input of a driving circuit 304, and that of the npn bipolar transistor T3032 is connected to a terminal Q23 which is an input of the driving circuit 304. A resistor R3001 is connected between the terminals Q21 and Q22 of the driving circuit 304, and a resistor R3002 between the terminals Q22 and Q23. A connection node (not denoted by a reference numeral) of the resistors R3001 and R3002 is biased to a predetermined voltage VR1 via the terminal Q22.

Figure 4:
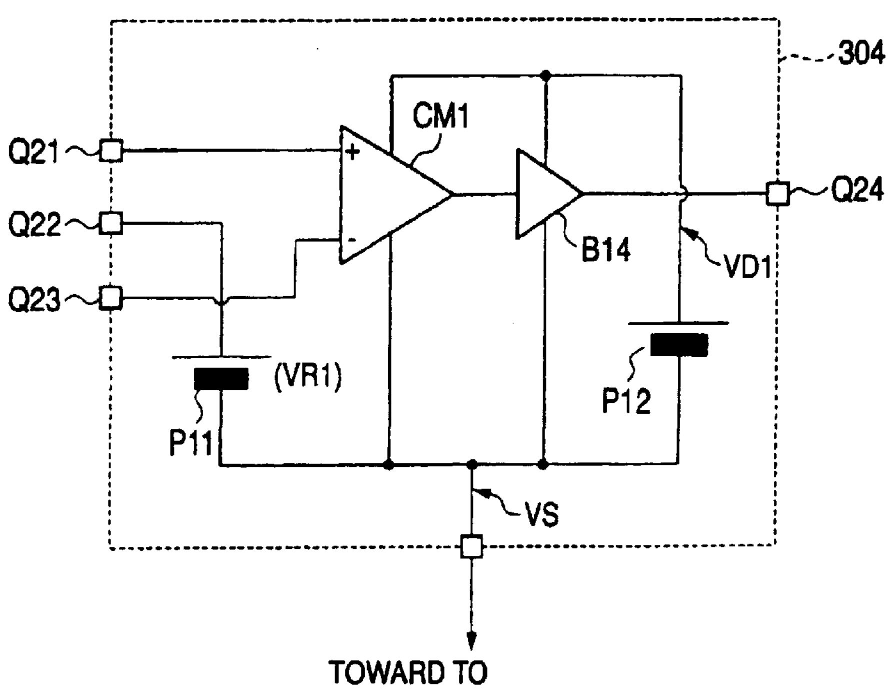
FIG. 4 is a circuit diagram showing the configuration of a driving circuit in the embodiment.

The driving circuit 304 functions as a so-called high-side driver which drives the output power-MOS transistor 401 in response to the complementary signals consisting of the; signals H3 and H4, and is configured by a biasing circuit P11, a comparator CM1, a buffer B14, and an internal power supply P12 as shown in FIG. 4. The non-inverting input (+) of the comparator CM1 is connected to the terminal Q21, and the inverting input (−) is connected to the terminal Q23. An output of the comparator CM1 is connected to an input of the buffer B14, and that of the buffer B14 is connected to the gate of the output power-MOS transistor 401 via a terminal Q24. The biasing circuit P11 is connected to the terminal Q22 so that the connection node of the resistors R3001 and R3002 is biased to the predetermined voltage VR1 based on the source voltage VS of the output power-MOS transistor 401. In the embodiment, the predetermined voltage VR1 is set to a value (=VS+VDD/2) which is obtained by adding one half of the power supply VDD to the source voltage VS of the power-MOS transistor 401. Since the power supply VDD is 10 V, a voltage which is obtained by adding one half of the power supply, or 5 V to the source voltage VS is the predetermined voltage VR1.

Figure 5:
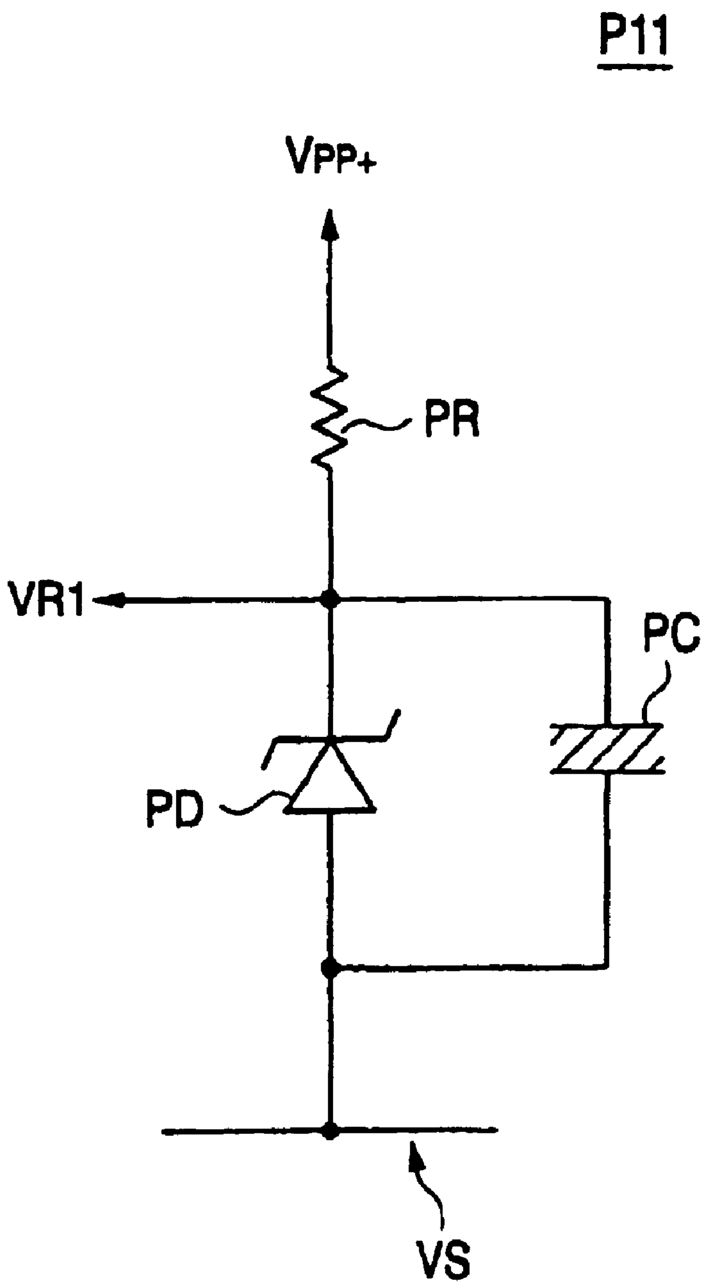
FIG. 5 is a diagram showing the configuration of a biasing circuit in the embodiment.

FIG. 5 is an example of the configuration of the biasing circuit P11. As shown in the figure, the biasing circuit P11 is configured by connecting in series a resistor PR and a Zener diode PD between the node where the above-mentioned source voltage VS appears (i.e., the source of the power-MOS transistor 401) and the positive power supply VPP+, and connecting a stabilizing capacitor PC in parallel with the Zener diode PD. A voltage appearing at the node of the resistor PR and the Zener diode PD is used as the predetermined voltage VR1. In the embodiment, the breakdown voltage of the Zener diode PD is set to 5 V which corresponds to one half of the power supply VDD (10 V). As a result, the voltage of a value (=VS+VDD/2) which is obtained by adding one half of the power supply VDD to the source voltage VS is generated as the predetermined voltage VR1.

Returning to FIG. 4, the internal power supply P12 generates a voltage VD1 which corresponds to the voltage (10 V) of the power supply VDD, based on the source voltage VS of the power-MOS transistor 401, and is configured in a basically identical manner as the biasing circuit shown in FIG. 5. In the internal power supply, however, the breakdown voltage of the Zener diode PD is set to 10 V which corresponds to the voltage of the power supply VDD. The internal power supply P12 generates the voltage VD1 which corresponds to the power supply VDD, based on the source voltage VS, and supplies a power to the comparator CM1 and the buffer B14. Therefore, the power supply system of the driving circuit 304 is changed with following the source voltage VS of the power-MOS transistor 401, and functions as a power supply which is equivalent to the power supply VDD as far as the comparator CM1 and the buffer B14 are concerned.

Returning again to FIG. 2, the driving circuit 305 functions as a so-called low-side driver which drives the output power-MOS transistor 402 in response to the complementary signals consisting of the signals L3 and L4, and is configured in a basically identical manner as the above-described driving circuit 304. In this driving circuit, however, the biasing circuit P11 generates the voltage VR2 which corresponds to one half of the power supply VDD based on the negative power supply VPP−. The internal power supply P12 generates a voltage VD2 which corresponds to the power supply VDD, based on the source voltage VS of the power-MOS transistor 402 (i.e., the negative power supply VPP−), and supplies a power to the comparator CM1 and the buffer B14. The terminals Q31, Q32, Q33, and Q34 correspond to the terminals Q21, Q22, Q23, and Q24, respectively. The connection relationships among the components are identical with those in the driving circuit 304, and their description is omitted.

In the embodiment, the values of the resistors R3021, R3023, and R3025, and resistors R3007 and R3008 are set in the following manner. In the case where the pnp bipolar transistor T3021 is in the on state, a current I1 flowing through the transistor is 4 mA, and currents I3 and I6 which are obtained by dividing the current are 3 mA and 1 mA, respectively. When a current I7 flowing through the resistor R3025 reaches 3 mA, the npn bipolar transistor T3031 is set to the off state. In the case where the pnp bipolar transistor T3021 is in the off state, the current 17 has a value which is smaller than 3 mA. The resistors R3022, R3024, and R3026 are set so as to have the same values as the resistors R3021, R3023, and R3025. The values of the resistors R3001 to R3006 are set so that the complementary signals to be supplied to the driving circuit 304 and 305 have an adequate amplitude.

Figure 6:
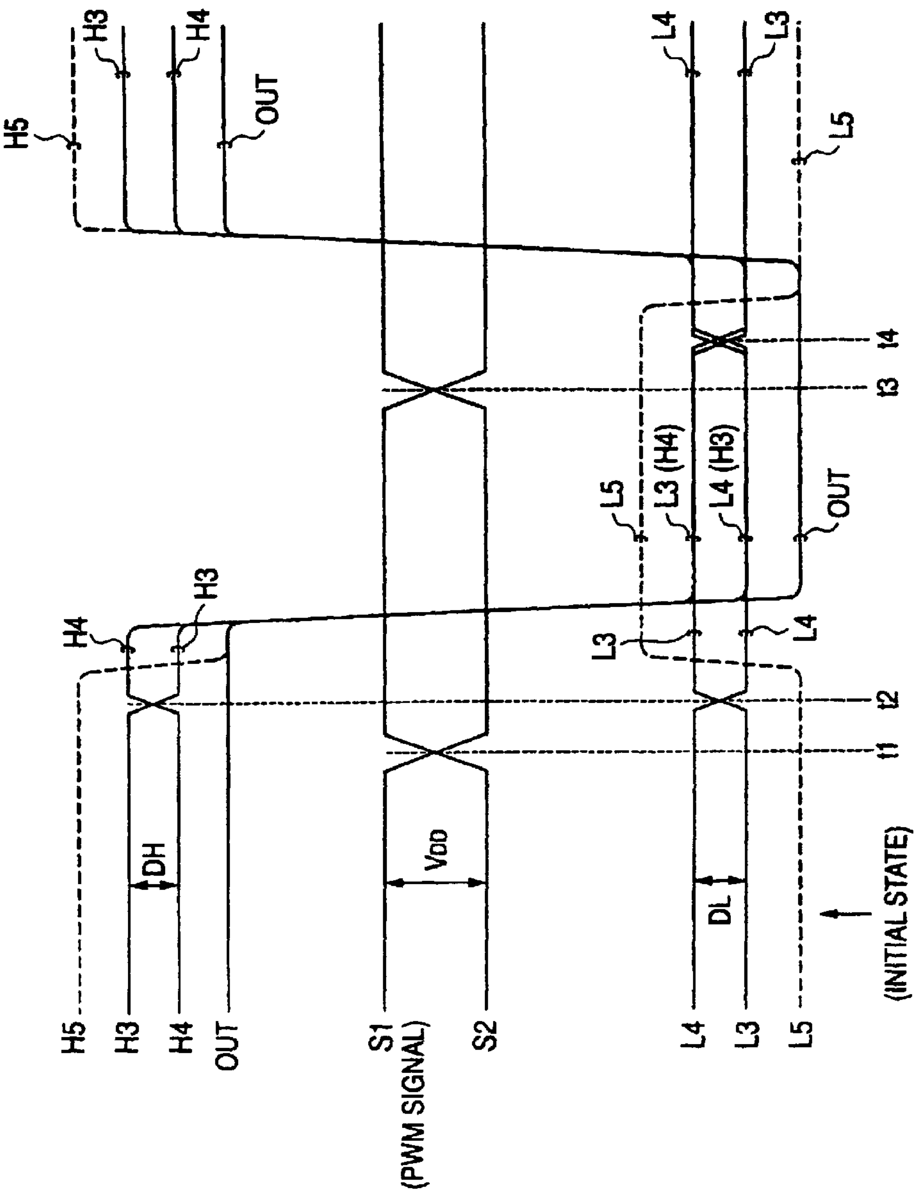
FIG. 6 is a waveform chart illustrating the operation of the class D amplifier of the embodiment.
Figure 7:
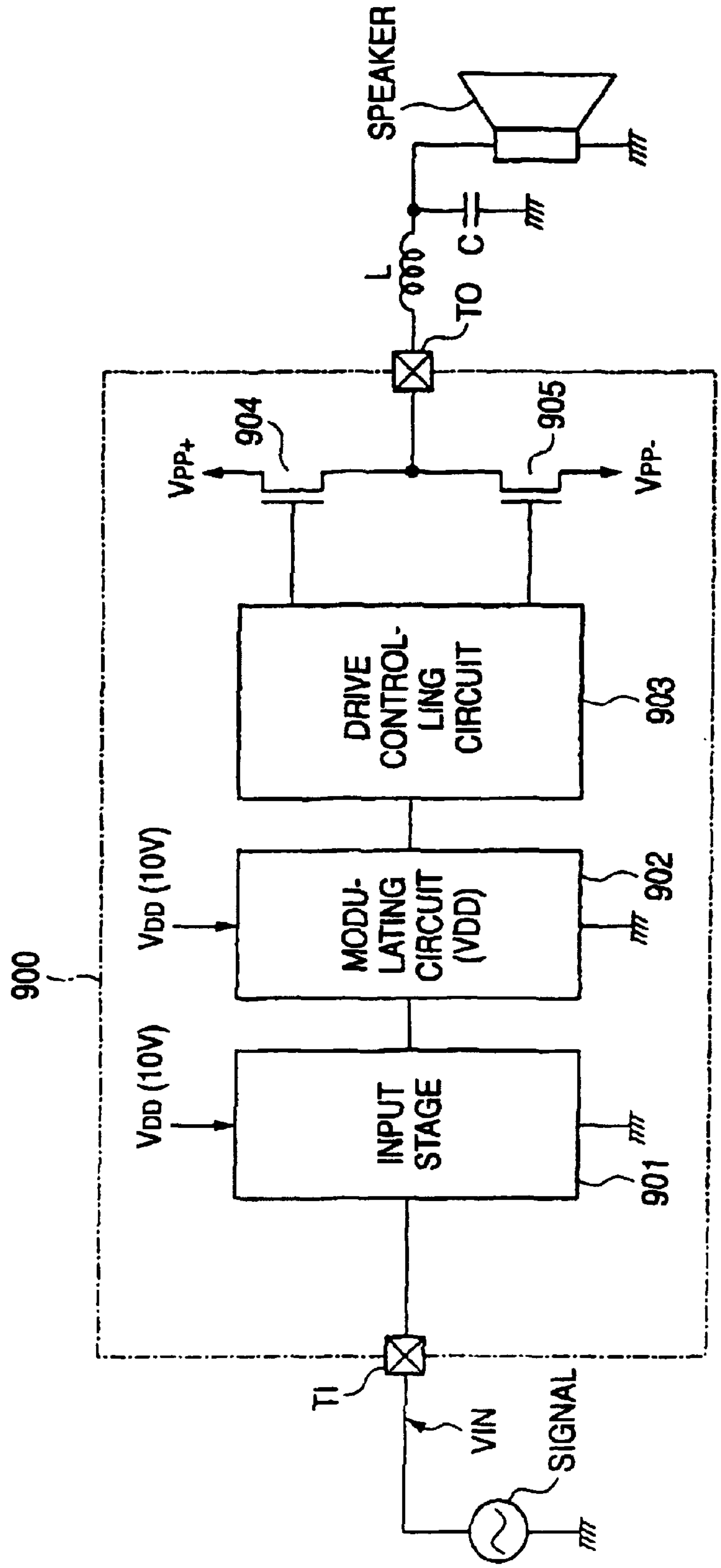
FIG. 7 is a diagram showing the configuration of a class D amplifier of the conventional art.

Next, the operation of the embodiment will be described. In FIG. 6 the PWM signal output from the modulating circuit. 200 is expressed with using the waveform of the positive-phase signal S1 because the PWM signal is positive-phase with the positive-phase signal S1.

The input stage 100 shown in FIG. 1 functions as an inverting amplifier of an amplification factor of "1" to output a signal in which the phase of the music signal VIN is inverted while setting the reference voltage VREF as the midpoint. As a result, the music signal VIN is converted to a signal conforming to the input characteristics of the modulating circuit 200 in the subsequent stage. The, modulating circuit 200 performs a modulation (PWM) process while reflecting information components of the music signal output from the preceding input stage 100 to the pulse width, thereby generating a PWM signal. On the basis of the PWM signal generated by the modulating circuit 200, the drive controlling circuit 300 complementarily drives the output power-MOS transistors 401 and 402. As a result, the power-amplified pulse signal appears as an output signal OUT at the output terminal TO.

Next, the operation of the drive controlling circuit 300 shown in FIG. 2 will be described in more detail with reference to FIG. 6. In response to the PWM signal output from the modulating circuit 200 shown in FIG. 1, the complementary signal generating circuit 301 generates the positive-phase signal S1 having the same phase as that of the PWM signal, and the negative-phase signal S2 having the phase opposite to that of the PWM signal. In the waveform chart shown in FIG. 6, in the initial state, the PWM signal output from the modulating circuit 200 is at the high-level, and the complementary signal generating circuit 301 which receives the signal outputs the high level as the positive-phase signal S1, and the low level as the negative-phase signal S2. In the initial state, therefore, a level difference corresponding to the power supply VDD (10 V) exists between the positive-phase signal S1 and the negative-phase signal S2, and the positive-phase signal S1 is higher than the negative-phase signal S2 by a voltage corresponding to the power supply VDD.

The positive-phase signal S1 and the negative-phase signal S2 which are output from the complementary signal generating circuit 301 are supplied to the emitters of the pnp bipolar transistors T3021 and T3022 via the resistors R3021 and R3022 constituting the signal converting circuit 302, respectively. When the high level is given via the resistor R3021, a current flows in the direction from the emitter of the pnp bipolar transistor T3021 to the base, and, when the emitter voltage reaches a voltage which is higher than the base voltage biased to the ground potential, by the base-emitter voltage Vbe, the pnp bipolar transistor T3021 is set to the on state. At this time, the current I1 flowing through the pnp bipolar transistor T3021 has a constant value (4 mA) which is determined by the value of the resistor R3021 and the terminal-to-terminal voltage. At the connection node ND1, the current I1 is divided into the current I3 (3 mA) and the current I6 (1 mA) in accordance with the ratio of the series resistance of the resistors R3023 and R3025 to that of the resistors R3004 and R3006. The current I3 flows toward the connection node ND3 via the resistor R3023, and the current I6 flows toward the terminal Q32 via the resistors. R3004 and R3006.

At the connection node ND3, the current 3 and a current flowing from the npn bipolar transistor T3031 flow as the current I7 into the negative power supply VPP− via the resistor R3025. When the current I7 containing the current I3 of 3 mA flows through the resistor R3025, the voltage of the connection node ND3 is raised, and the voltage of the base of the npn bipolar transistor T3031 with respect to the emitter becomes equal to or lower than the base-emitter voltage Vbe. Therefore, the npn bipolar transistor T3031 is set to the off state, and stops the flow of the current I9. As described above, when the pnp bipolar transistor T3021 is set to the on state, a current of 1 mA flows as the current I6 toward the terminal Q32 via the resistor R3006 connected to the terminal of the driving circuit 305, and no current flows through the resistor R3001 connected between the terminals of the driving circuit 304 (namely, the current I9 is 0 mA).

On the other hand, since the negative-phase signal S2 is at the low level at this time, the pnp bipolar transistor T3022 is set to the off state to stop the current flow (I2=0 mA). Therefore, the potential of the connection node ND2 is lowered, and a current I5 which is determined by the resistors R3005, R3003, R3024, and R3026 flows from the terminal Q32 of the driving circuit 305 into the connection node ND2. Namely, the current I5 flows out from the terminal Q32 via the resistor R3005 which is connected between the terminals of the driving circuit 305. Since the pnp bipolar-transistor T3022 is in the off state, the current I5 flows as it is as a current I4 toward the connection node ND4 via the resistor R3024. In this case, a current I8 which flows through the resistor R3026 is smaller than 3 mA as described above. As a result, the voltage of the base of the npn bipolar transistor T3032 with respect to the emitter becomes equal to or higher than the base-emitter voltage Vbe, and the npn bipolar transistor T3032 is set to the on state to allow the current I10 to flow. Namely, the current I10 begins to flow from the terminal Q22 via the resistor R3002 which is connected between the terminals of the driving circuit 304.

As described above, the current I9 does not flow, and the current I10 flows out from the terminal Q22 of the driving circuit 304 via the resistor R3002. Therefore, the voltage of the terminal Q22 of the driving circuit 304 is equal to the bias voltage VR1, and that of the terminal Q23 is lower than the bias voltage VR1, with the result that the signal H3 is higher in level than the signal H4. The comparator CM1 of the driving circuit 304 outputs a signal level corresponding to the level relationship between the signals H3 and H4. At this time, since the level of the signal H3 is higher than that of the signal H4, the comparator CM1 outputs the high level, and the buffer B14 which receives the high level outputs a signal H5 of a level which corresponds to the power supply VDD based on the source of the power-MOS transistor 401, to the gate of the transistor. As a result, the power-MOS transistor 401 is set to the on state. As described later, the power-MOS transistors 401 and 402 are controlled so as to become complementarily conductive. Therefore, the power-MOS transistor 401 is in the on state, and the power-MOS transistor 402 is in the off state, so that the level of the output signal OUT (i.e., the source voltage VS) is raised to the voltage of the positive power supply VPP+.

At this time, the internal circuit of the driving circuit 304 is supplied with the voltage VD1 based on the source voltage VS from the internal power supply P12, and hence the power supply system of the driving circuit 304 is raised with following the source voltage VS of the power-MOS transistor 401. In addition the input threshold of the comparator CM1 is raised together with the source voltage VS. However, the voltage VR1 generated by the biasing circuit P11 is raised with following the source voltage VS. Therefore, the levels of the signals H3 and H4 maintain the state conforming to the input characteristics of the comparator CM1 constituting the driving circuit 304, and the power-MOS transistor 401 is, kept to the on state. Under this state, the level of the signal H5 is higher than the positive power supply VPP+ by the voltage VD1 (=VDD).

By contrast, the current I5 flows out from the terminal Q32 of the driving circuit 305 via the resistor R3005, and the current I6 flows into the terminal Q32 via the resistor R3006. Therefore, the signal L3 supplied to the terminal Q31 of the driving circuit 305 is lower than the bias voltage VR2, and the signal L4 supplied to the terminal Q33 is higher than the bias voltage VR2. As a result, the signal L3 is lower in level than the signal L4. Therefore, the driving circuit 305 outputs a signal L5 of a level which is equal to the source voltage (VPP−) of the power-MOS transistor 402, to the gate of the transistor. Therefore, the power-MOS transistor 402 is set to the off state.

In the initial state, consequently, the power-MOS transistor 401 is in the on state, and the power-MOS transistor 402 is in the off state, thereby producing a state where the high level corresponding to the voltage of the positive power supply VPP+ is output as the output signal OUT.

When the PWM signal is transferred at time t1 shown in FIG. 6 from the initial state to the low level, the pnp bipolar transistors T3021 and T3022 are set respectively to the off state and the on state in response to this transfer. Therefore, the current I9 begins to flow, and the current I10 does not flow, so that the level relationship between the signals H3 and H4 is inverted at time t2. Consequently, the output signal of the comparator CM1 which receives the signals H3 and H4 is changed from the high level (a voltage state which is higher by the voltage VD1 than the positive power supply VPP+) to the low level (a voltage state which corresponds to the source voltage VS in FIG. 4), and also the output signal H5 of the buffer B14 which receives the output signal is changed to the low level. As a result, the gate voltage of the power-MOS transistor 401 becomes equal to the source voltage VS (=the potential of the output terminal TO), and the power-MOS transistor 401 is set to the off state.

When the PWM signal is transferred at time t1 to the low level and the pnp bipolar transistors T3021 and T3022 are set respectively to the off state and the on state, the currents 15 and 16 flow in directions opposite to those in a period before the time t1, and the level relationship between the signals L3 and L4 is inverted. Consequently, the signal L5 output from the driving circuit 305 which receives the signals is changed to the high level. As a result, the gate voltage of the power-MOS transistor 402 becomes higher than the source voltage by the voltage VD2, and the power-MOS transistor 402 is set to the on state. When the power-MOS transistor 402 is set to the on state, the source voltage VS of the power-MOS transistor 401 is lowered in accordance with the output signal OUT, and also the voltage VD1 which is generated by the internal power supply P12 based on the voltage is lowered.

At this time, also the voltage VR1 generated by the biasing circuit P11 is lowered in accordance with the change of the source voltage VS of the power-MOS transistor 401, and hence the levels of the signals H3 and H4 are lowered together with the power supply system of the driving circuit 304 while the level relationship between the signals is maintained. Therefore, the signal output from the comparator CM1 is kept to the low level (the source voltage VS), and, during the process of transferring the output signal OUT to the low level (the negative power supply VPP−), the off state of the power-MOS transistor 401 is maintained.

As described above, when the PWM signal is transferred at time t1 from the initial state to the low level, one of the power-MOS transistors, or the power-MOS transistor 401 is set to the off state, and the other power-MOS transistor 402 is set to the on state, so that the output signal OUT is transferred from the positive power supply VPP+ to the negative-power supply VPP− and the low level is output.

When the PWM signal is returned at time t3 to the high level, the signal H3 becomes the high level, and the signal H4 becomes the low level at time t4 in response to this transfer. Therefore, the driving circuit 304 which receives the signals H3 and H4 outputs the high level as the signal H5, and the power-MOS transistor 401 is set to the on state. In the low-side driver, the signal L3 becomes the low level, and the signal L4 becomes the high level. Therefore, the driving circuit 305 which receives the signals L3 and L4 outputs the low level as the signal L5, and the power-MOS transistor 402 is set to the off state.

When the power-MOS transistor 401 is set to the on state, the source voltage VS (=the output signal OUT) of the transistor is raised, and also the voltage VD1 which is generated by the internal power supply P12 based on the voltage is raised. However, also the voltage VR1 generated by the biasing circuit P11 is raised with following the source voltage VS, and the level relationship between the signals H3 and H4 is maintained. Therefore, the level of the output signal of the comparator CM1 is kept to the high level (the voltage state which is higher than the source voltage VS by the voltage VD1). During the process of transferring the output signal OUT to the high level, therefore, the on state of the power-MOS transistor 401 is maintained. When the PWM signal becomes the high level at time t3, therefore, the power-MOS transistor 401 is set to the on state, and the power-MOS transistor 402 is set to the off state, so that the high level corresponding to the positive power supply VPP+ is output as the output signal OUT.

As a result, the pulse signal which is modulated on the basis of the music signal VIN is power-amplified and then output as the output signal OUT.

In the embodiment described above, signals are transmitted by means of a current from the complementary signal generating circuit 301 to the driving circuits 304 and 305, and the circuit impedance can be lowered. Even if a parasitic capacitance is formed between paths of such signals and the output terminal TO, therefore, a smaller amount of noise enters the signal paths during the process of transferring the output signal OUT. Consequently, the amplifying operation can be stabilized.

Although an embodiment of the invention has-been described above, the invention is not restricted to the embodiment. Modifications and the like are included in the scope of the invention unless departing the concept of the invention. In the embodiment described above, the signal converting circuit 302 and the current driving circuit 303 are configured by using bipolar transistors. Alternatively, the circuits may be configured by using MOS transistors.

According to the invention, first complementary signals are generated from a PWM signal, the first complementary signals are converted to second complementary signals based on a negative power supply, and the second complementary signals are supplied to driving circuits. Therefore, output power-MOS transistors can be driven and controlled without using special circuit techniques or electronic components, and the use of a high-breakdown voltage process can be suppressed to a minimum required level.

What is claimed is:

1. A class D amplifier comprising:

a modulating circuit which modulates an input signal to a pulse signal;

a first output transistor, a current path of which is connected between a positive power supply and an output terminal; and a second output transistor, a current path of which is connected between a negative power supply and the output terminal; and a drive controlling circuit which complementarily drive the first and second output transistors based on the pulse signal from the modulating circuit, the drive controlling circuit including:

a signal generating circuit which generates first complementary signals including positive-phase and negative-phase signals with respect to the pulse signal;

a signal converting circuit which converts the first complementary signals to second complementary signals having a voltage component based on the negative power supply;

a current driving circuit which, in response to the second complementary signals, outputs third complementary signals having a current component flowing toward the negative power supply;

a first driving circuit which, in response to the third complementary signals, drives the first output transistor; and a second driving circuit which, in response to the second complementary signals, drives the second output transistor.

2. The class D amplifier according to claim 1, wherein the signal converting circuit includes:

first and second bipolar transistors, bases of which are commonly biased to a ground potential, and emitters of which are connected to outputs of the signal generating circuit from which the first complementary signals are output via first and second resistors, respectively; and third and fourth resistors connected between collectors of the first and second bipolar transistors and the negative power supply, respectively.

3. The class D amplifier according to claim 2, wherein the current driving circuit includes:

third and fourth bipolar transistors, emitters of which are connected to the third and fourth resistors, respectively, collectors of which are connected to inputs of the first driving circuit, respectively, and bases of which are commonly biased to a predetermined potential based on the negative power supply.

4. The class D amplifier according to claim 3, wherein values of the first and second resistors and the third and fourth resistors are set so that emitter voltages of the third and fourth bipolar transistors are lower than the predetermined potential based on the negative power supply by a base-collector voltage.

* * * * *